United States Patent [19]
Gong et al.

[11] Patent Number: 6,151,349
[45] Date of Patent: Nov. 21, 2000

[54] AUTOMATIC FLUORINE CONTROL SYSTEM

[75] Inventors: Mengxiong Gong, San Marcos; Jason R. Carlesi; Michael C. Binder, both of San Diego; Palash P. Das, Vista, all of Calif.

[73] Assignee: Cymer, Inc., San Diego, Calif.

[21] Appl. No.: 09/368,208

[22] Filed: Aug. 4, 1999

Related U.S. Application Data

[63] Continuation-in-part of application No. 09/034,870, Mar. 4, 1998, Pat. No. 6,005,879.
[51] Int. Cl.[7] ..................................................... H01S 3/10
[52] U.S. Cl. ................................ 372/58; 372/59; 372/57
[58] Field of Search .......................................... 372/57–59

[56] References Cited

U.S. PATENT DOCUMENTS 6,018,537  1/2000  Hofmann et al. ......................... 372/25

*Primary Examiner*—Leon Scott, Jr.
*Attorney, Agent, or Firm*—John R. Ross, Esq.

[57] ABSTRACT

An excimer laser system with an automatic fluorine control system to permit precise control of the fluorine concentration within an $F_2$ "sweet spot" in a gas discharge laser chamber. This is done with a computer control system which monitors laser parameters, determines $\Delta E/\Delta V$, the change of pulse energy with voltage, and automatically and precisely controls the fluorine concentration based on $\Delta E/\Delta V$ without the need to actually measure the fluorine concentration.

16 Claims, 7 Drawing Sheets

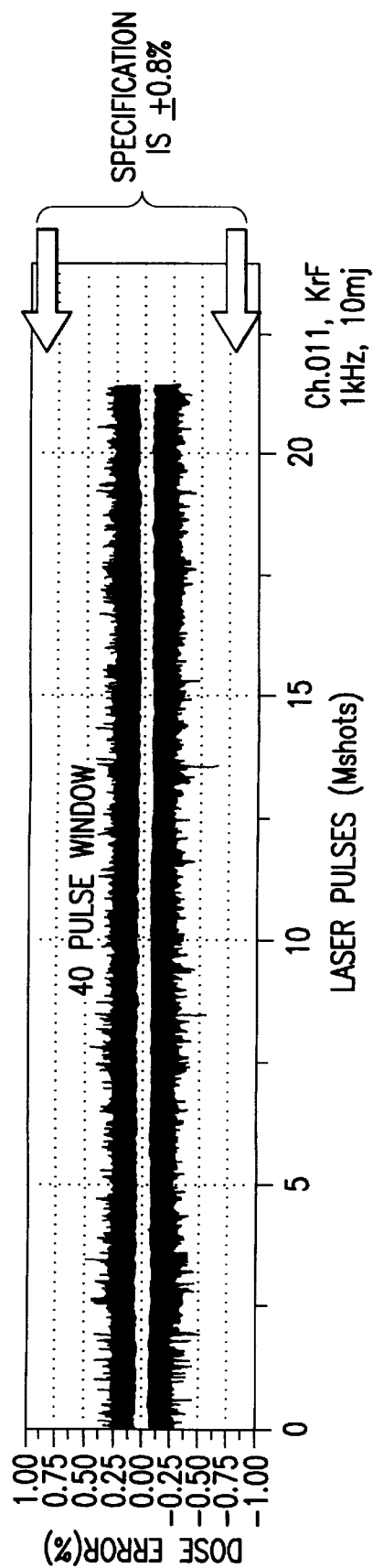
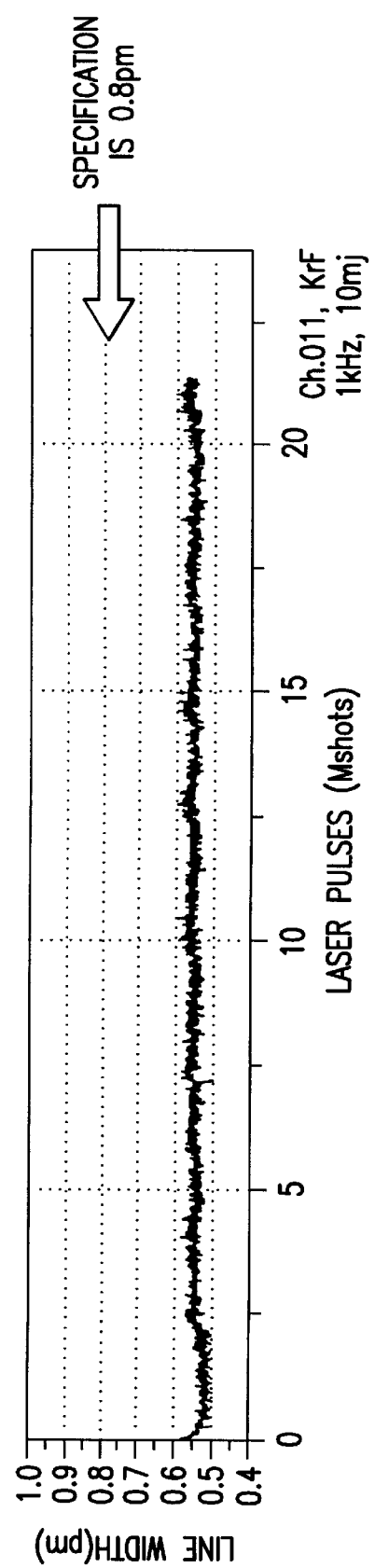
FIG. 6C
FIG. 6D

AUTOMATIC FLUORINE CONTROL SYSTEM

This application is a continuation-in-part of Ser. No. 09/034,870 filed Mar. 4, 1998 now U.S. Pat. No. 6,005,879 entitled "Pulse Energy Control for Excimer Lasers". This invention relates to excimer lasers and in particular for equipment and methods for controlling laser gas in excimer lasers.

BACKGROUND OF THE INVENTION

Excimer lasers are well known. An important use of excimer lasers is to provide the light source for integrated circuit lithography. The type of excimer laser currently being supplied in substantial numbers for integrated circuit lithography is the KrF laser which produces ultraviolet light at a wavelength of 248 nm. A similar excimer laser, the ArF laser, provides ultraviolet light at 193 nm. These lasers typically operate in a pulse mode at pulse rates such as 1,000 Hz to 4,000 Hz. The laser beam is produced in a laser chamber containing a gain medium created by the discharge through a laser gas between two elongated electrodes of about 28 inches in length and separated by about ⅝ inch. The discharge is produced by imposing a high voltage such as about 20,000 volts across the electrodes. For the KrF laser, the laser gas is typically about 1% krypton, 0.1% fluorine and about 99% neon. For the ArF laser the gas is typically about 3 to 4% argon, 0.1% fluorine and 96 to 97% neon. In both cases in order to achieve high pulse rates of about 1,000 Hz to 4,000 Hz, the gas must be circulated between the electrodes at speeds of about 500 to 2,000 inches per second.

Fluorine is the most reactive element known and it becomes even more reactive when ionized during the electric discharge. Special care must be exercised to utilize in these laser chambers materials such as nickel coated aluminum which are reasonably compatible with fluorine.

Further, laser chambers are pretreated with fluorine to create passification layers on the inside of the laser chamber walls. However, even with this special care, fluorine will react with the walls and other laser components which results in a relatively regular depletion of the fluorine. The rates of depletion are dependent on many factors, but for a given laser at a particular time in its useful life, the rates of depletion depend primarily on the pulse rate and load factor if the laser is operating. If the laser is not operating, the depletion rate is substantially reduced. The rate of depletion is further reduced if the gas is not being circulated. To make up for this depletion, new fluorine is typically injected at intervals of about 1 to 3 hours. Rather than inject pure fluorine it is a typical practice to inject into KrF lasers a mixture of 1% fluorine, 1% krypton and 98% neon. For example, in a typical 1000 Hz KrF excimer laser used for lithography, the quantity of its fluorine, krypton, neon mixture injected to compensate for the fluorine depletion varies from about 10 scc per hour when the laser is not operating and the laser gas is not being circulated to about 500 scc per hour when the laser is running continuously at 1000 Hz. The typical injection rate is about 120 scc per hour when the chamber fan is circulating the laser gas, but the laser is not firing.

The unit "scc" refers to "standard cubic centimeters". Other commonly used units for describing quantities of fluorine in a particular volume are percent (%) fluorine, parts per million and kilo Pascals; the latter term sometimes refers to the partial pressure of the fluorine gas mixture. (This is because the amount of fluorine injected into a laser chamber is typically determined (directly or indirectly) by the measured chamber pressure increase while the 1% fluorine gas mixture is being injected.) A 320 scc per hour injection rate of the 1% fluorine mixture would correspond to a depletion in the fluorine concentration over 2 hours from about 0.10 percent to about 0.087 percent. The actual quantity of fluorine depleted in two hours as measured in grams of pure fluorine would be about 10 milligrams during the two hour period corresponding to the above 320 scc/hour injection rate (i.e., 640 scc of the 1% fluorine mixture injected at two-hour intervals) of the fluorine gas mixture.

For integrated circuit lithography a typical mode of operation requires laser pulses of constant pulse energy such as 10 mJ/pulse at about 1000 Hz to 4000 Hz which are applied to wafers in bursts such as about 300 pulses (a duration of about 300 milliseconds at 1,000 Hz) with a dead time of a fraction of a second to a few seconds between bursts. Modes of operation may be continuous 24 hours per day, seven days per week for several months, with scheduled down time for maintenance and repairs of, for example, 8 hours once per week or once every two weeks. Therefore, these lasers must be very reliable and substantially trouble-free.

In typical KrF and ArF excimer lasers used for lithography, high quality reproducible pulses with desired pulse energies of about 10 mJ/pulse may be obtained over a substantial range of fluorine concentration from about 0.08 percent (800 parts/million or about 24 kPa partial pressure of the fluorine gas mixture) to about 0.12 percent (1,200 parts/million or about 36 kPa). Over the normal laser operating range the discharge voltage required to produce the desired pulse energy increases as the fluorine concentration decreases (assuming other laser parameters remain approximately constant). FIG. 1 shows the typical relationship between discharge voltage and fluorine concentration for constant pulse energy of 10 mJ and 14 mJ. The discharge voltage in the range of 15 kv to 20 kv is typically controlled by a feedback system which calculates a charging voltage (in the range of about 550 volts to 800 volts) needed to produce (in a pulse compression-amplification circuit) the discharge voltage which is needed to produce the desired laser pulse energy, the discharge voltage being roughly proportional to the charging voltage. This feedback circuit therefore sends a "command voltage" signal in the range of (550 volts to 800 volts) to a power supply to provide charging voltage pulses.

Prior art techniques typically utilize the relationship between discharge voltage and fluorine concentration to maintain constant pulse energy despite the continuous depletion of fluorine. The discharge voltage of prior art excimer lasers can be changed very quickly and accurately and can be controlled with electronic feedback to maintain constant pulse energy. Accurate and precise control of fluorine concentration in the past has proven difficult. Therefore, in typical prior art KrF and ArF laser systems, the fluorine concentration is allowed to decrease for periods of about 1 to 4 or 5 hours while the charging voltage and thus the discharge voltage is regulated by a feedback control system to maintain approximately constant pulse energy output. Periodically at intervals of about 1 to a few hours, fluorine is injected during short injection periods of a few seconds. Thus, in normal operations fluorine concentration gradually decreases from (for example) about 0.10 percent to about 0.09 percent over a period of about 1 to a few hours while the discharge voltage is increased over the same period from for example about 600 volts to about 640 volts. The injection of fluorine at the end of the 1 to a few hour period (when the voltage has drifted up to about 640 volts) brings the fluorine concentration back to about 0.10 percent and the feedback control (maintaining constant pulse energy) automatically reduces the voltage back to 600 volts. This basic process is typically repeated for several days. Since contamination gradually builds up in the laser gas over a period of several days, it is usually desirable to replace substantially all of the gas in the laser with new laser gas at intervals of about 5–10 days. FIG. 2 describes the prior art fluorine injection technique discussed above. The voltage values represent average values of control voltage commands and indirectly represent average values of the actual charging voltage.

The above-described prior art technique is effectively used today to provide long term reliable operation of these excimer lasers in a manufacturing environment. However, several laser parameters, such as bandwidth, beam profile and wavelength, are adversely affected by the substantial swings in the discharge voltage and fluorine concentration.

A substantial number of techniques have been proposed and patented for measuring and controlling the fluorine concentration in excimer lasers to within more narrow limits than those provided under the above described prior art technique. These techniques have generally not been commercially pursued.

What is needed is an economical method that minimizes $F_2$ variation in the laser gas and thus minimizes the change in beam properties resulting from $F_2$ variation.

SUMMARY OF THE INVENTION

The present invention provides an excimer laser system with an automatic fluorine control system to permit precise control of the fluorine concentration in a gas discharge laser chamber.

Applicants have discovered that the beam parameters such as pulse energy stability, wavelength 5 stability and bandwidth are very sensitive to changes in the fluorine concentration. They have also learned from experience that as a laser ages the fluorine concentration which provides the most desirable combination of beam parameters may vary. Also, as stated in the background section, it is well known that a decrease in the fluorine concentration will result in an increase in the discharge voltage and that laser life is shortened by both high discharge voltage and by high fluorine concentration. Thus, there is a need for careful selection of the fluorine concentration both for the purposes of assuring good beam parameters and achieving long laser lifetimes. This selection involves intelligent tradeoff decisions, and once those tradeoff decisions are made a fluorine concentration "sweet spot" is determined which represents the most desirable range of fluorine concentration. When this sweet spot determination has been made, it is important to operate the laser within the fluorine concentration sweet spot. This is done with a computer control system which monitors laser parameters, determines $\Delta E/\Delta V$, (the change of pulse energy with voltage) and automatically and precisely controls the fluorine concentration based on $\Delta E/\Delta V$ without the need to actually measure the fluorine concentration.

In a preferred embodiment, a manifold system is provided which can be utilized to permit precise injection of small quantities (referred to as "micro injections") at rates approaching continuous fluorine injection.

DETAILED DESCRIPTION OF PREFERRED EMBODIMENTS

Preferred embodiments of the present invention can be described by reference to the figures.

MICRO INJECTIONS BASED ON $\Delta E/\Delta V$

Figure 3A:
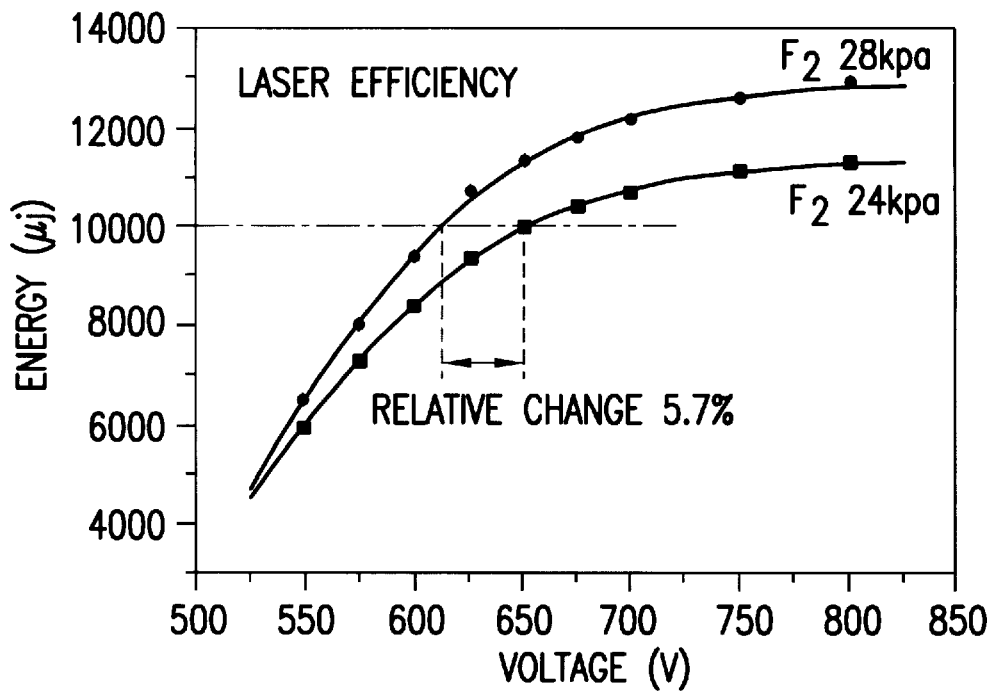
FIGS. 3A and 3B are graphs of pulse energy and $\Delta E/\Delta V$ as a function of charging voltage.
Figure 3B:
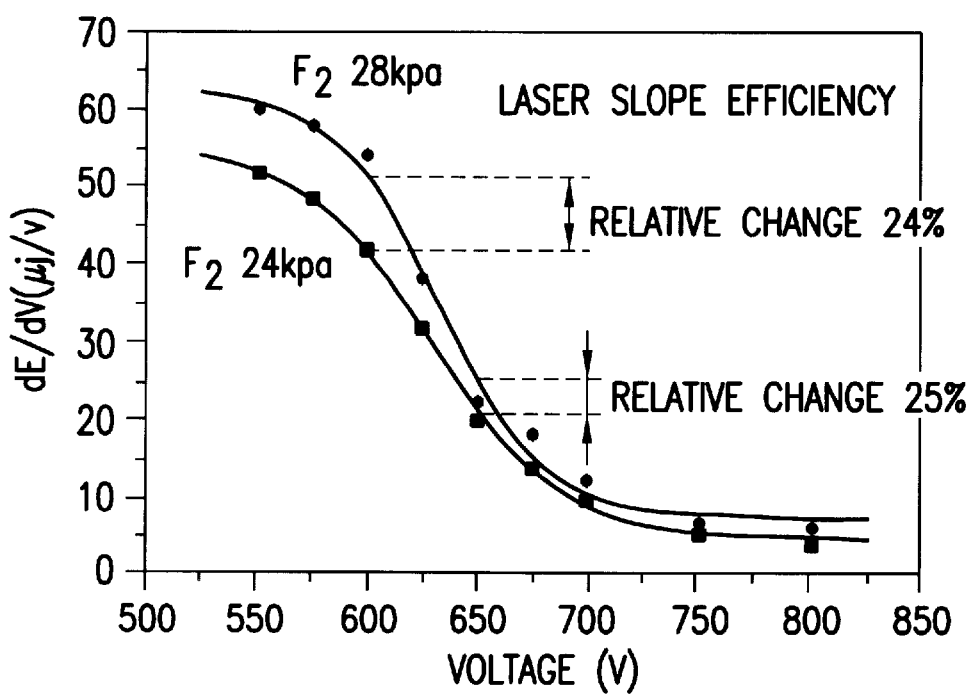

FIG. 3A is a typical graph of pulse energy v charging voltage for a KrF laser with $F_2$ concentrations of 28 kpa and 24 kpa. FIG. 3B is a graph showing the variation of $\Delta E/\Delta V$ with charging voltage for the same two $F_2$ concentration values. As indicated on the graphs the absolute values of the $\Delta E/\Delta V$ (corresponding to constant pulse energy, E) varies much more consistently with $F_2$ than does the charging voltage. As indicated in FIG. 3B there is a relatively consistent change of about 25% in the values of $\Delta E/\Delta V$ produced by a change in the $F_2$ concentration from 24 kPa to 28 kPa over a large range of values of charging voltage. Based on this discovery, Applicants have developed a fluorine control technique designed to keep the laser operating in desired sweet spots by monitoring the parameter $\Delta E/\Delta V$ representing the change of pulse energy with charging voltage.

As discussed in the Background section, a preferred operating mode for an excimer laser used as a light source in stepper and scanner equipment for integrated circuit production is called a "burst mode". In this mode the laser is operated in "bursts" such as about 300 pulses at a pulse rate of 1000 Hz to 4000 Hz, each 300-pulse burst illuminates a single exposure site of about 2 or 4 square centimers on a wafer which may be about 8 inches in diameter. There are typically many (such as about 85) exposure sites on a single wafer each site corresponding to one or more integrated circuits. Each burst is separated by an idle period of, for example, of 0.3 seconds. After, for example, 85 "bursts" covering 85 exposure sites, the laser may be idle for a longer period of about 9 seconds while a new wafer is moved into position by the stepper or scanner. A prior art energy control algorithm attempts to adjust the charging voltage for each pulse such that the total energy in the burst is constant with minimum pulse energy variation within the burst. The specified charging voltage and the pulse energy for each pulse is monitored by the computer control system. Even though the laser controls are attempting to keep pulse energy constant (as well as keeping the total burst energy constant), there is during each burst significant pulse-to-pulse variation of both pulse energy and specified charging voltage. Therefore, the computer can easily be programmed to determine average values of pulse energy, E and charging voltage, V, and it can calculate values of $\Delta E/\Delta V$. Since these are typically about 300 pulses per burst coming at the rate of 1000 to 4000 pulses per second, a large number of values of $\Delta V$ and $\Delta E$ can be summed and averaged within short time periods for good statistics; therefore values of $\Delta E/\Delta V$ can be determined with good accuracy.

FINDING THE SWEET SPOT

In order to find a desired $F_2$ "sweet spot" the laser is operated at various $F_2$ concentrations while measuring performance parameters such as energy stability, bandwidth and charging voltage needed for desired laser pulse energy. The $F_2$ concentration range which produces the most desirable combination of parameters is determined. Values of pulse energy, E, charging voltage V and a $\Delta E/\Delta V$ corresponding to the sweet spot are measured. An $F_2$ injection value of $(\Delta E/\Delta V)_i$ is determined. A computer is provided with an algorithm which will during laser production operation call for an $F_2$ micro injection whenever measured values of $\Delta E/\Delta V$ decrease to or below $(\Delta E/\Delta V)_i$. In a preferred embodiment the algorithm also monitors other specified laser parameters and if any are out of specifications an alarm may be activated and/or an alternate $F_2$ injection processes may be instituted.

Figure 4:
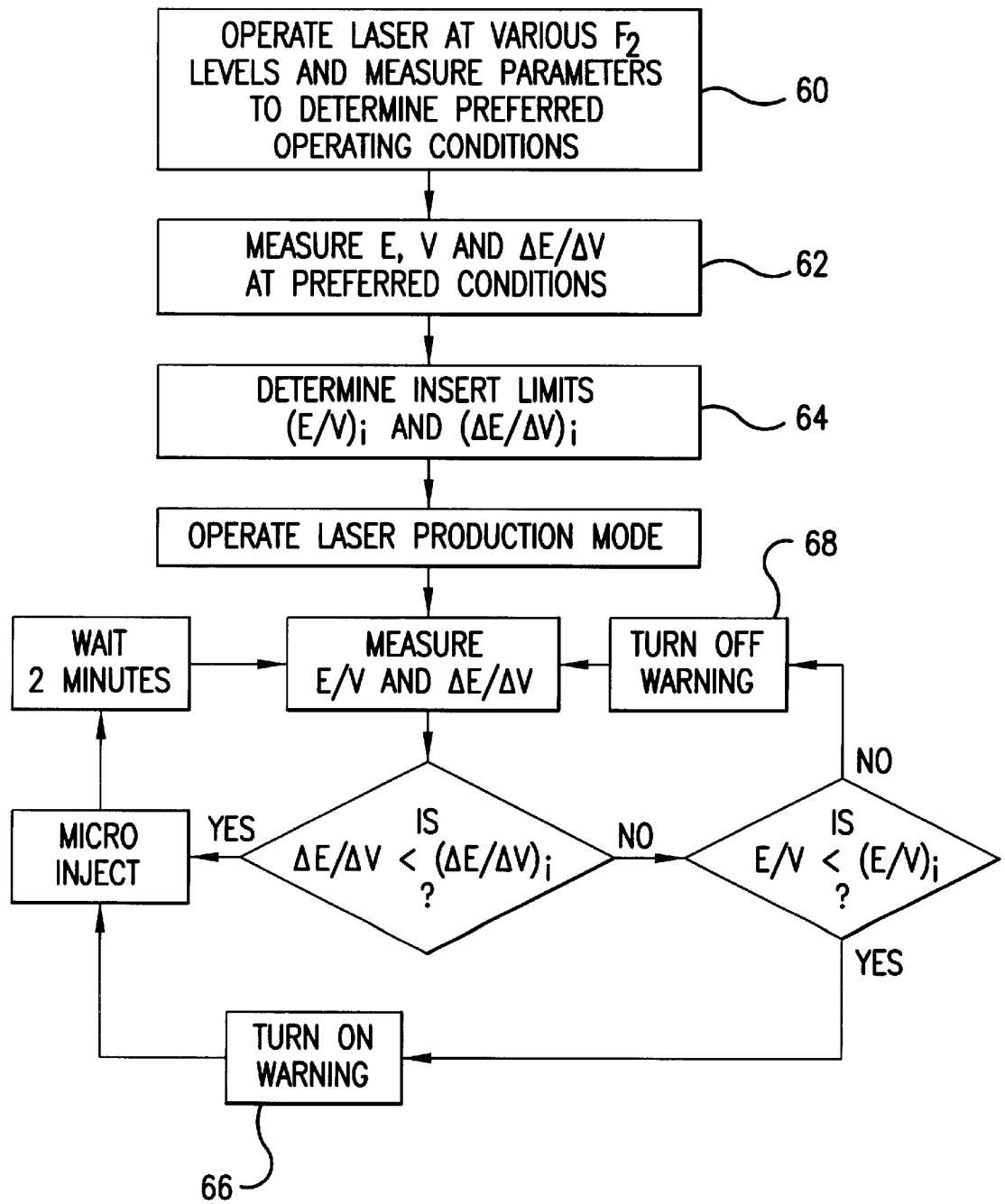
FIG. 4 is a flow diagram describing an $F_2$ control algorithm.

FIG. 4 is a flow chart describing a preferred embodiment of the present invention which provides for micro injections of $F_2$ based on measured values $\Delta E/\Delta V$ during laser operation. In this embodiment as shown in blocks 60, 62 and 64 the laser is operated at a variety of $F_2$ concentrations to determine a desired operation sweet spot. That sweet spot is defined by a preferred value of $\Delta E/\Delta V$ and a $\Delta E/\Delta V$ range (the $\Delta E/\Delta V$ range corresponds approximately to the change in $\Delta E/\Delta V$ resulting from a single micro injection of $F_2$). A value referred to a $(\Delta E/\Delta V)_i$ representing the minimum of the $\Delta E/\Delta V$ range is determined and stored in the computer memory. In this preferred embodiment a value of $(\Delta E/\Delta V)_i$ is also established representing the bottom of an E/V range, but the E/V range is made substantially larger (for example twice as large) than the $\Delta E/\Delta V$ range resulting from the micro injection. The remainder of the blocks in FIG. 4 relate to $F_2$ control while the laser is operating in a production mode as a light source for integrated circuit lithography. Values of E/V and $\Delta E/\Delta V$ are determined by the computer control and a micro injection is called for if $\Delta E/\Delta V$ drops below $(\Delta E/\Delta V)_i$. After an injection a two minute time period is provided for the laser to stabilize before control process resumes. As long as $\Delta E/\Delta V$ is within the sweet spot the laser control will continue to monitor $\Delta E/\Delta V$. The algorithm also checks E/V and will call for an inject if that parameter falls below $(E/V)_i$. This should not normally happen and the operator is warned that an unusual event has occurred as shown at 66. The warning is turned off at 68 when E/V exceeds $(E/V)_i$. Although not shown, additional routines could be inserted in the algorithm to permit the laser controls to loop out of this algorithm in desired situations such as excessively high values of V.

Several techniques are available for determining values of $\Delta E/\Delta V$ for use in the control program. Applicants have experimented with several including using the mean of 1000 values (negative values were discarded) and using the mode of 1000 values. Applicants have also experimented with making measurements of $\Delta E/\Delta V$ by periodically dithering the voltage by about 2 volts in order to obtain single larger values of $\Delta E$ and $\Delta V$. Each of these techniques produced results which were approximately equivalent.

Figure 6A:
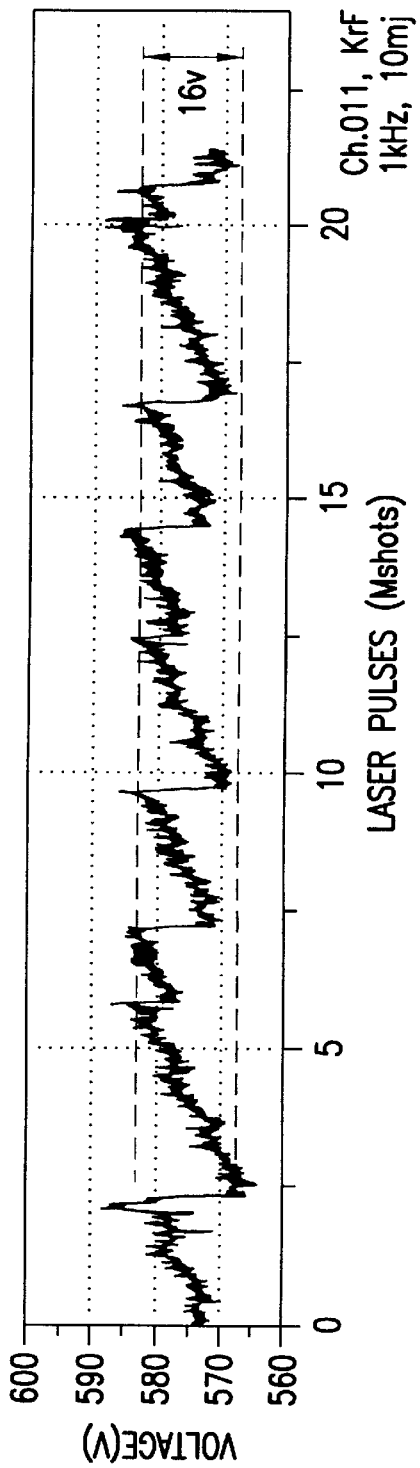
FIG. 6 is a set of charts showing test results from using a preferred embodiment of the present invention.
Figure 6B:
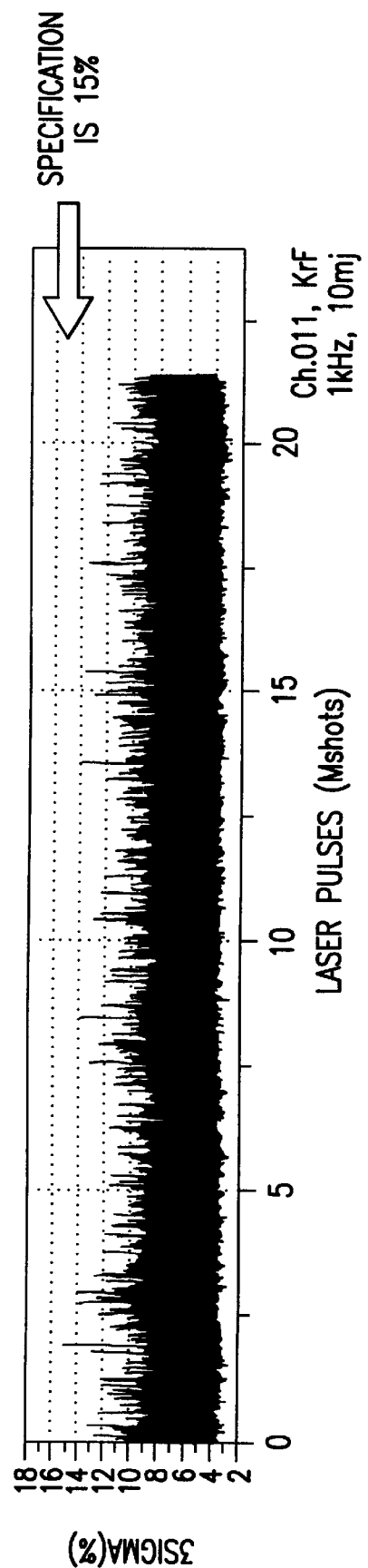

The test results from the utilization of a prototype $\Delta E/\Delta V$ $F_2$ control algorithm is shown in FIG. 6. During this demonstration the voltage was controlled within about 20 volts and injections occurred at intervals of about one hour. Lasing continued during injection. As shown by the figure all specification parameters remained within limits. Even more precise control would result from smaller micro injections. (For example, as indicated below very small injections could be made at intervals of about 3 to 5 minutes which would result in almost constant $F_2$ and charging voltage over long periods of operation.)

FLUORINE INJECTION EQUIPMENT

Fluorine Depletion

Figure 5:
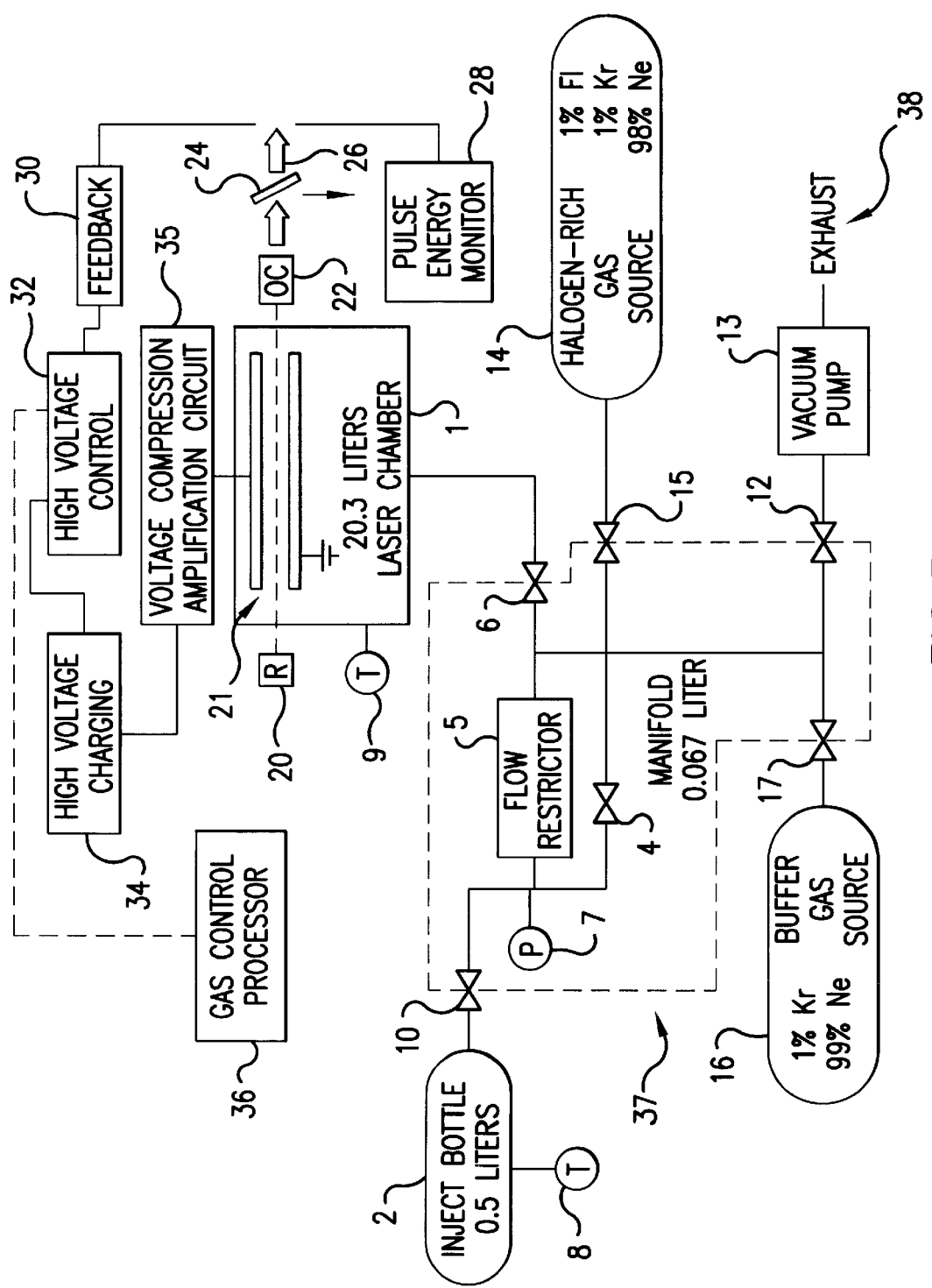
FIG. 5 is a block diagram demonstrating a preferred embodiment of the present invention.

Laser chamber 1 as shown in FIG. 5 comprises 20.3 liters of laser gas. Nominally, as described above for a KrF laser, the constituents are 1.0 percent krypton, 0.1 percent fluorine and the remainder neon. The 0.1 percent fluorine represents a volume of about 0.0020 liters or 2 ml of fluorine at 3 atm. In mass terms the nominal amount of fluorine in the laser chamber is about 8 grams (81 mg). The partial pressure of the fluorine is about 280 Pa, pure fluorine (corresponding to about 28 kPa of the 1% fluorine mixture). During normal operations with the laser operating at a duty factor of about 40 percent (which is typical for a lithography laser) fluorine is depleted at a rate of about 3.3 mg per hour (this corresponds to about 5% of the fluorine in the chamber per hour). In terms of partial pressure of pure fluorine, this normal depletion rate of fluorine is about 1.45 Pa per hour. To make up for this depletion using the 1% fluorine gas mixture, a volume of the mixture equivalent to about 1.15 kPa per hour is added to the chamber.

As stated in the background section, the fluorine depletion rate is far from constant. If the laser fan is operating but no lasing is taking place the fluorine depletion rate is cut approximately in half. If the fan is shutdown the fluorine depletion rate is cut to about ¼ the 40% duty factor depletion rate. At 100% duty factor the depletion rate is about double the 40% duty factor depletion rate.

Figure 1:
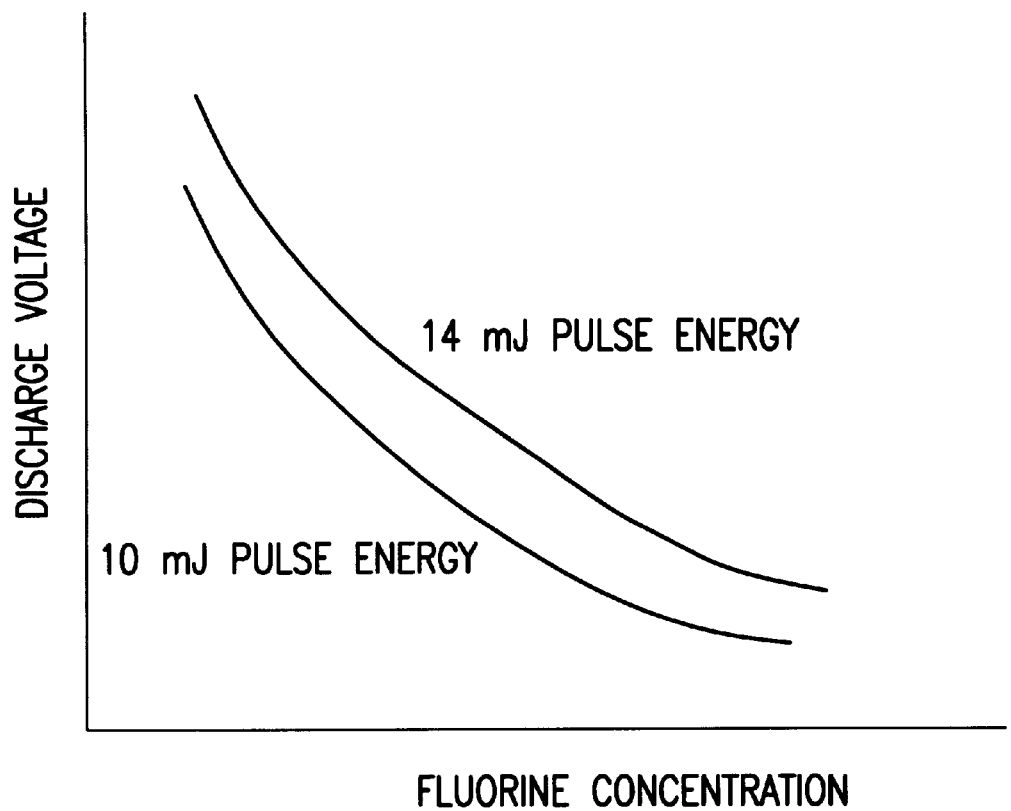
FIG. 1 is a graph showing the typical relationship between discharge voltage and fluorine concentration in a typical commercial KrF or ArF excimer laser.
Figure 2:
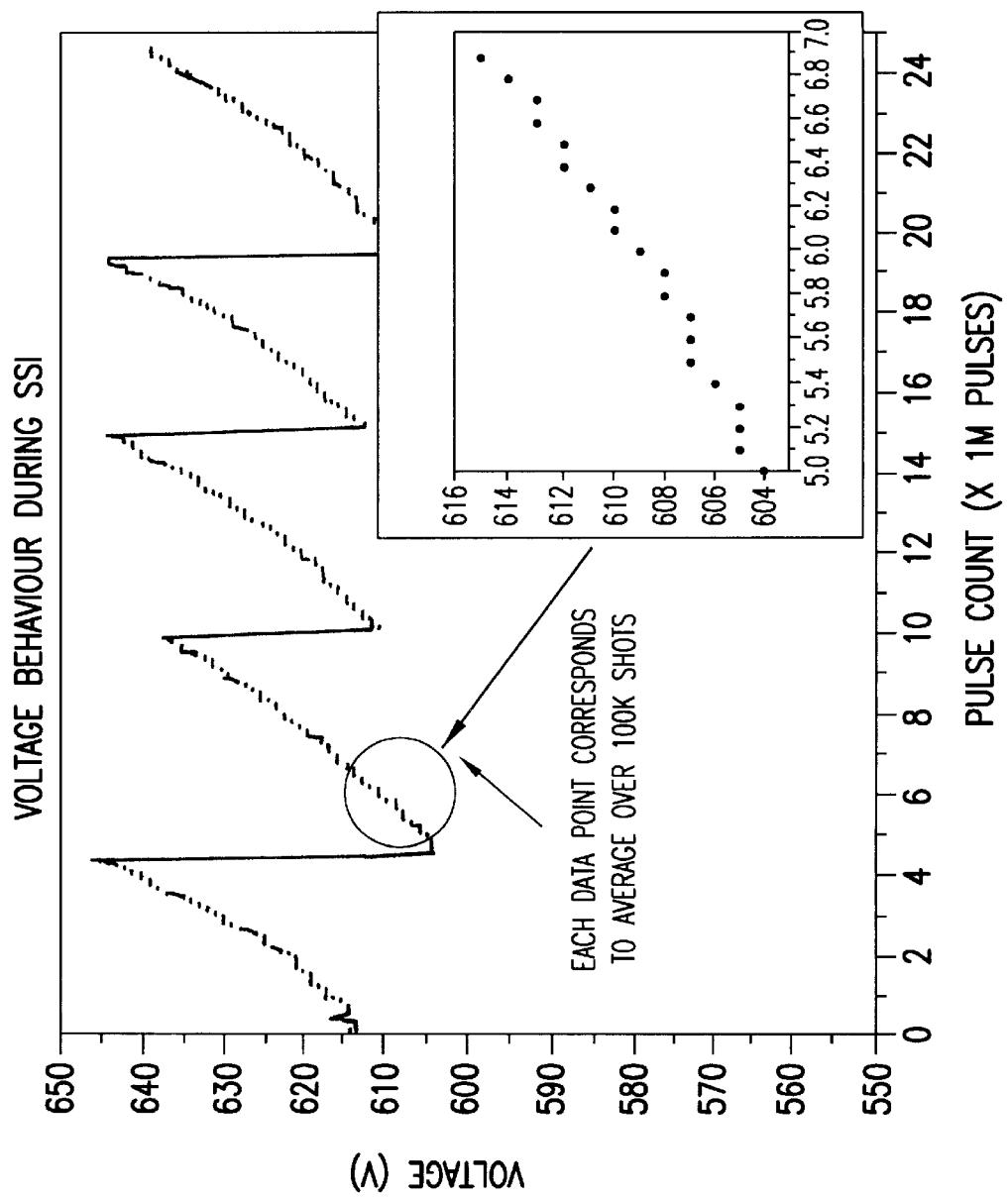
FIG. 2 is a graph showing a widely used prior art method of fluorine concentration control.

FIG. 5 shows a system which provides automatic control and is designed for precisely controlled periodic fluorine injections at intervals as low as about 3 to 5 minutes. As indicated above, for a typical modern 1000 Hz, 10 mJ lithography KrF excimer laser, a the fluorine depletion rate for operation at a load factor of 40% would be about 3.3 mg per hour or 55 micrograms per minute. This decrease in the fluorine concentration would require an increase in the discharge voltage of 800 volts per hour or about 66 volts for each five minutes (assuming no fluorine is added). For example, a voltage increase of about 18,000 volts to about 18,066 volts during a five minute period would be typical. This increase in the discharge voltage is accomplished by increasing the high voltage charging voltage by a corresponding increment (such as from 568 volts to 582 volts). Thus, if the sweet spot corresponds to a 575 volt charging voltage at a pulse energy of 10 mJ, the system in FIG. 5 is programmed to adjust the charging voltage as necessary to control the pulse energy to 10 mJ per pulse until the measured $\Delta E/\Delta V$ value decreases to $(\Delta E/\Delta V)_i$; as the result of fluorine depletion. At this point about 290 micrograms of fluorine is injected which improves the efficiency of the laser so that the pulse energy discharge voltage feedback circuit automatically causes the voltage to decrease to about 568 volts, then as further depletion of fluorine occurs the voltage will gradually increase to 582 volts again at which time another injection will be called for. This sweet spot is about 2 percent of the nominal voltage as shown in FIG. 6, a very great improvement over prior art techniques such as that shown in FIG. 2 where the voltage swings are about 8 percent. As stated above, even smaller injections made more often would further decrease the V and $F_2$ swings.

Gas Replacement

The process described above basically replaces depleted fluorine on an almost continuous basis. Since the fluorine gas source is only 1% fluorine it also replaces a portion of the Kr and Ne in the chamber on an almost continuous basis. Nevertheless, even though a portion of the laser gas is being substantially continuously replaced, operation in this mode results in a build up of contaminants in the laser gas which reduces the efficiency of the laser. This reduction in efficiency requires a very gradual long term increase in the voltage and/or an increase in the fluorine concentration to maintain the desired pulse energy. For this reason, normal practice with prior art systems suggest that periodically the laser be shutdown for a substantially complete gas exchange. This substantially complete gas exchange is referred to as a refill. These periods may be determined based on number of laser pulses such as 100,000,000 pulses between refills, or refill times may be determined based on calendar time since the last refill or a combination of pulses and calendar time. Also the refill times may be determined by the magnitude of the charging voltage needed for a desired output at a particular fluorine concentration. Preferably after a refill a new test for the "sweet spot" should be run. Also, periodically in between fills the sweet spot test should be performed so that if the sweet spot changes the operator will know where the new sweet spot is.

A refill may be accomplished using the system shown in FIG. 5 as follows. With valves 10, 6, 15, 12, 17, and 4 closed, valves 6 and 12 are opened, vacuum pump 13 is operated and the laser chamber is pumped down to an absolute pressure of less than 13 kPa. (A direct pump down line may be provided between the chamber 1 and vacuum pump 13 to permit a quick pump down.) Valve 12 is closed. Valve 16 is opened and 1% Kr, 99% Ne buffer gas from buffer gas bottle 16 is added to the chamber to fill it to a pressure equivalent to 262 kPa at 50° C. (Note that for this 20.3 liter laser chamber, temperature correction can be approximated using a $\Delta P/\Delta T$ correction of 1 kPa/°C. for a chamber temperature deviation from 50° C. So if the chamber temperature is 23° C. it would be filled to 247 kPa.) Valve 17 is closed and valve 15 is opened and a quantity of the 1% Fl, 1% Kr, 98% Ne mixture from halogen rich gas bottle 14 is added to chamber 1 to fill it to a pressure equivalent to 290 kPa at 50° C. (Note the same temperature correction discussed above can be used.) This will produce a gas mixture in the chamber of approximately 0.1% Fl, 1.0% Kr and 98.9% Ne. When the chamber is heated to about 50° C. the pressure will be about 3 atm or 290 kPa.

While the invention has been described in detail herein in accord with certain preferred embodiments thereof, many modifications and changes therein may be effected by those skilled in the art. Persons skilled in the art well recognize that the principals discussed above with respect to KrF excimer lasers will apply equally well to ArF excimer lasers. Persons skilled in the art of excimer laser design will also recognize that the feedback control system could be used to purposely vary the fluorine concentration on a substantially real time basis either for the purpose of producing a laser beam having a time variation or for the purpose of maintaining the beam parameters constant in which case the fluorine variation would be chosen to compensate for some effect which would otherwise have produced a time variation in the beam output. Accordingly, it is intended by the appended claims to cover all such modifications and changes as fall within the true spirit and scope of the invention.

What is claimed is:

1. An excimer laser system comprising:
    A) a laser chamber containing:
        1) two spaced apart elongated electrodes;
        2) a laser gas comprising:
            a noble gas,
            fluorine,
            a buffer gas;
    B) a blower for flowing the laser gas between the two spaced apart electrodes;
    C) a fluorine source;
    D) a means for determining $\Delta E/\Delta V$; and
    E) a fluorine control system arranged to automatically control fluorine injection flow based on determined values of $\Delta E/\Delta V$ in order to permit said laser to operate within a desired sweet spot determined by fluorine concentration in the laser chamber.

2. An excimer laser as in claim 1 wherein the noble gas is krypton.

3. An excimer laser as in claim 1 wherein the noble gas is argon.

4. An excimer laser as in claim 1 wherein krypton comprises about 1 percent of the laser gas fluorine comprises about 0.1 percent of the laser gas and the buffer gas is neon which comprises about 98.9 percent of the laser gas.

5. An excimer laser as in claim 1 wherein said feedback control system comprises temperature and pressure sensors and a processor programmed to adjust fluorine injection based on temperature deviations from a reference temperature.

6. An excimer laser as in claim 1 wherein said laser feedback control system is programmed to control fluorine flow to keep said laser operating within a predetermined sweet spot.

7. An excimer laser as in claim 6 wherein sweet spot is defined as a range of fluorine concentration.

8. An excimer laser as in claim 6 wherein said sweet spot is defined by a slope of a voltage vs. $F_2$ concentration curve.

9. An excimer laser as in claim 8 wherein said feedback control system is programmed to inject fluorine at intervals close enough together to simulate continuous injection in order to permit a voltage defined sweet spot no larger than about 2 percent of the nominal sweet spot voltage.

10. An excimer laser as in claim 8 and further comprising an exhaust line separate from said inject manifold.

11. An excimer laser as in claim 1 wherein said inject bottle has a gas volume of more than 0.5 liters.

12. An excimer laser as in claim 1 and further comprising a bleed bottle having a volume of more than 0.3 liters.

13. An excimer laser as in claim 1 and further comprising gas piping permitting gas flow from a relatively high pressure location of said chamber to said inject bottle and from said inject bottle to a relatively low pressure location of said chamber.

14. A process for controlling the fluorine concentration in a gas discharge laser comprising the steps of:
    A) operating the laser at various $F_2$ concentration levels and determining laser parameters to determine a preferred operating range;
    B) determine $\Delta E/\Delta V$ within said preferred operating range;
    C) determine a $\Delta E/\Delta V$ injection value, $(\Delta E/\Delta V)_i$; and
    D) during laser operation inject a quantity of $F_2$ when $\Delta E/\Delta V$ decreases to or below $(\Delta E/\Delta V)_i$.

15. A process as in claim 14 wherein the quantity of $F_2$ injected is less than 5 milligrams.

16. A process as in claim 14 wherein said process is automatic and controlled by a computer processor programmed with a $F_2$ control algorithm.

* * * * *

UNITED STATES PATENT AND TRADEMARK OFFICE
CERTIFICATE OF CORRECTION

PATENT NO. : 6,151,349
DATED : November 21, 2000
INVENTOR(S) : Gong et al.

It is certified that error appears in the above-identified patent and that said Letters Patent is hereby corrected as shown below:

Column 8,
Line 22, change "feedback" to -- fluorine --;
Line 31, after "wherein" insert -- said --;
Line 35, after "said" change "feedback" to -- fluorine --;
Line 40, at the end of the line, after "comprising" insert -- : an inject manifold; --;
Line 42, after "claim 1" insert -- further comprising: an inject bottle; --.

Signed and Sealed this

Eighteenth Day of October, 2005

JON W. DUDAS
*Director of the United States Patent and Trademark Office*